US011276690B2

(12) United States Patent
Cheng et al.

(10) Patent No.: US 11,276,690 B2
(45) Date of Patent: Mar. 15, 2022

(54) INTEGRATED SEMICONDUCTOR DEVICE AND ELECTRONIC APPARATUS

(71) Applicant: CSMC TECHNOLOGIES FAB2 CO., LTD., Jiangsu (CN)

(72) Inventors: Shikang Cheng, Wuxi New District (CN); Yan Gu, Wuxi New District (CN); Sen Zhang, Wuxi New District (CN)

(73) Assignee: CSMC TECHNOLOGIES FAB2 CO., LTD., Wuxi New District (CN)

( * ) Notice: Subject to any disclaimer, the term of this patent is extended or adjusted under 35 U.S.C. 154(b) by 0 days.

(21) Appl. No.: 16/755,817

(22) PCT Filed: Nov. 21, 2018

(86) PCT No.: PCT/CN2018/116680
§ 371 (c)(1),
(2) Date: Apr. 13, 2020

(87) PCT Pub. No.: WO2019/128556
PCT Pub. Date: Jul. 4, 2019

(65) Prior Publication Data
US 2020/0335498 A1 Oct. 22, 2020

(30) Foreign Application Priority Data

Dec. 28, 2017 (CN) .......................... 201711465185.3

(51) Int. Cl.
*H01L 27/088* (2006.01)
*H01L 29/78* (2006.01)
(52) U.S. Cl.
CPC ...... *H01L 27/0883* (2013.01); *H01L 29/7802* (2013.01)
(58) Field of Classification Search
CPC ..................... H01L 29/7802; H01L 21/76224
See application file for complete search history.

(56) References Cited

U.S. PATENT DOCUMENTS 5,578,860 A * 11/1996 Costa .................. H01L 27/0251
257/362
6,166,404 A * 12/2000 Imoto ................. H01L 21/8234
257/192

(Continued)

FOREIGN PATENT DOCUMENTS

CN 103872137 A * 4/2014
CN 103872137 A 6/2014

(Continued)

OTHER PUBLICATIONS

International Search Report dated Feb. 22, 2019 in the parent application PCT/CN2018/116680 (2 pages).

*Primary Examiner* — Moin M Rahman
*Assistant Examiner* — Mohammad A Rahman
(74) *Attorney, Agent, or Firm* — Polsinelli PC (57) ABSTRACT

The present application provides an integrated semiconductor device and an electronic apparatus, comprising a semiconductor substrate and a first doped epitaxial layer having a first region, a second region, and a third region; a partition structure is arranged in the third region; the first region is formed having at least two second doped deep wells, and the second region is formed having at least two second doped deep wells; a dielectric island partially covers a region between two adjacent doped deep wells in the first region and second region; a gate structure covers the dielectric island; a first doped source region is located on the two sides of the gate structure, and a first doped source region located in the same second doped deep well is separated; a first doped trench is located on the two sides of the dielectric island in the first region, and extends laterally to the first doped source region.

19 Claims, 2 Drawing Sheets

(56) References Cited

U.S. PATENT DOCUMENTS

| | | | |
|---|---|---|---|
| 2018/0204838 A1* | 7/2018 | Hsu | H01L 21/761 |
| 2019/0051647 A1* | 2/2019 | Weyers | H01L 29/7802 |
| 2019/0067424 A1* | 2/2019 | Kudou | H01L 29/7802 |

FOREIGN PATENT DOCUMENTS

| | | | |
|---|---|---|---|
| CN | 103928464 A | | 7/2014 |
| CN | 105226097 A | * | 8/2015 |
| CN | 105226097 A | | 1/2016 |

* cited by examiner

INTEGRATED SEMICONDUCTOR DEVICE AND ELECTRONIC APPARATUS

CROSS-REFERENCE OF THE RELATED APPLICATIONS

This application is a National Phase of International Application No. PCT/CN2018/116680, filed Nov. 21, 2018, which claims priority to Chinese Patent Application No. 201711465185.3 filed on Dec. 28, 2017, and entitled "INTEGRATED SEMICONDUCTOR DEVICE AND ELECTRONIC APPARATUS", the contents of which are expressly incorporated by reference herein in their entireties.

TECHNICAL FIELD

The present disclosure relates to the field of semiconductor manufacturing, and particularly relates to an integrated semiconductor device and an electronic apparatus.

BACKGROUND

Conventional semiconductor devices include enhanced and depletion semiconductor devices, for example, the vertical double diffused metal oxide field effect devices (VDMOS) including enhanced VDMOS devices and depletion VDMOS devices. They have advantages of good switching characteristics and low power consumption, and have wide applications in LED driving and power adapter. However, most of the conventional products are packaged independently, which leads to the disadvantages of increased process cost and large chip area.

SUMMARY

According to various embodiments of the present disclosure, an integrated semiconductor device and an electronic apparatus are provided.

An integrated semiconductor device, at least includes:

a semiconductor substrate;

a first dopant type epitaxial layer located on a front side of the semiconductor substrate and comprising a first region, a second region, and a third region, an isolation structure is provided in the third region;

second dopant type deep wells located in the first dopant type epitaxial layer, comprising at least two second dopant type deep wells located in the first region and at least two second dopant type deep wells located in the second region;

dielectric islands located on the first dopant type epitaxial layer, a part of the dielectric islands covering a region between two adjacent second dopant type deep wells in the first region, a part of the dielectric islands covering a region between two adjacent second dopant type deep wells in the second region, and the dielectric islands being not in contact with the adjacent second dopant type deep wells;

gate structures located on the first dopant type epitaxial layer and covering the dielectric islands and a part of regions of the second dopant type deep wells on both sides of the dielectric island;

first dopant type source regions located in the second dopant type deep wells below both sides of the gate structures, and the first dopant type source regions in the same second dopant type deep well being separated by a part of a region of the first dopant type deep well; and first dopant type trenches located on both sides of the dielectric islands and in the first dopant type epitaxial layer, the first dopant type trenches extending laterally to the first dopant type source regions;

the first dopant type is opposite to the second dopant type.

The present disclosure also provides an electronic apparatus which includes the foregoing integrated semiconductor device.

BRIEF DESCRIPTION OF THE DRAWINGS

To better describe and illustrate embodiments and/or examples of the disclosure disclosed herein, reference can be made to one or more accompanying drawings. The additional details or examples used to describe the accompanying drawings should not be construed as limiting the scope of any of the disclosed disclosure, the presently described embodiments and/or examples, and the presently understood optional mode of the disclosure.

DETAILED DESCRIPTION

In order to facilitate the understanding of the disclosure, the disclosure will be more fully described below with reference to the relevant accompanying drawings. The preferred embodiments of the disclosure are shown in the accompanying drawings. However, the present disclosure may be implemented in many different forms and is not limited to the embodiments described herein. To the contrary, the purpose of providing these embodiments is to make the disclosure of the disclosure more thorough and comprehensive.

Unless otherwise defined, all technical and scientific terms used herein have the same meaning as is commonly understood by those skilled in the art of the disclosure. The terms used in the specification of the disclosure are merely intended to describe specific embodiments and are not intended to limit the disclosure. The term "and/or" used herein includes any and all combinations of one or more associated listed items.

In order to have a thorough understanding of the disclosure, detailed steps and structures will be presented in the following description in order to illustrate the technical options presented in the disclosure. The preferred embodiments of the disclosure are described in detail below. However, in addition to these detailed descriptions, the disclosure may have other implementations.

EMBODIMENT 1

The integrated semiconductor devices of the present disclosure are exemplified by using the integrated VDMOS semiconductor devices as an example as follows. It should be understood that the example of the integrated VDMOS semiconductor devices in the embodiment is merely exemplary, and any integrated semiconductor devices with depletion and enhanced devices are applicable to the disclosure.

In order to address problems in the prior art, the present disclosure provides an integrated semiconductor device. The structure of the semiconductor device of the present disclosure is described by way of example below with reference to FIG. 1.

The integrated semiconductor device described in the disclosure includes:

a semiconductor substrate;

a first dopant type epitaxial layer located on a front side of the semiconductor substrate and including a first region, a second region, and a third region, an isolation structure is provided in the third region;

second dopant type deep wells located in the first dopant type epitaxial layer, including at least two second dopant type deep wells located in the first region and at least two second dopant type deep wells located in the second region;

dielectric islands located on the first dopant type epitaxial layer, a part of the dielectric islands cover a region between two adjacent second dopant type deep wells in the first region, a part of the dielectric islands cover a region between two adjacent second dopant type deep wells in the second region, and the dielectric islands being not in contact with the adjacent second dopant type deep wells;

gate structures located on the first dopant type epitaxial layer and covering the dielectric islands and a part of regions of the second dopant type deep wells on both sides of the dielectric island;

first dopant type source regions located in the second dopant type deep wells below both sides of the gate structures, and the first dopant type source regions in the same second dopant type deep well are separated by a part of a region of the first dopant type deep well; and first dopant type trenches located on both sides of the dielectric islands and in the first dopant type epitaxial layer, the first dopant type trench extending laterally to the first dopant type source regions;

the first dopant type is opposite to the second dopant type.

Figure 1:
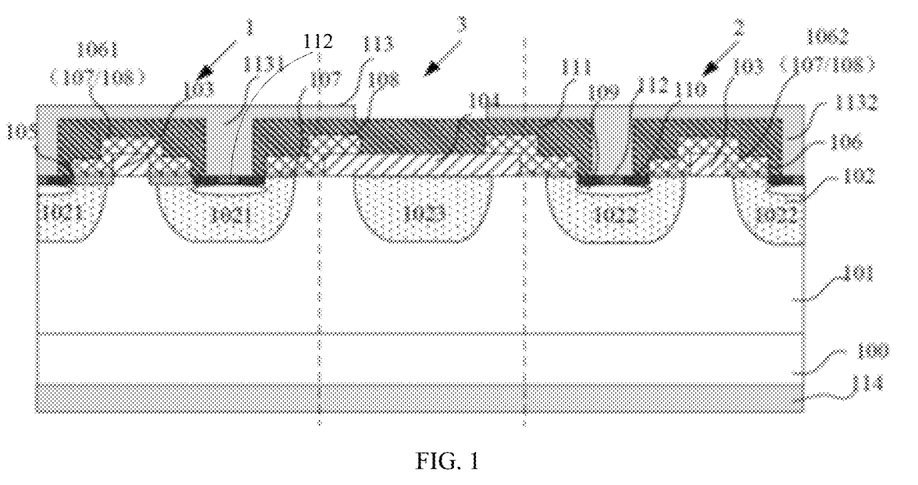
FIG. 1 is a schematic diagram of a semiconductor device according to an embodiment of the present disclosure.

Referring to FIG. 1, the integrated semiconductor device described in the disclosure includes a semiconductor substrate 100, specifically, it may be of at least one of the following materials mentioned below: Si, Ge, SiGe, SiC, SiGeC, InAs, GaAs, InP, InGaAs or other III/V compound semiconductors. It may also include a multilayer structure of these semiconductors, or may be silicon on an insulator (SOI), silicon on an insulator (SSOI), germanium on an insulator (S—SiGeOI), germanium on an insulator (SiGeOI), germanium on an insulator (GeOI), or the like. Exemplarily, the semiconductor substrate is of a first dopant type.

It should be noted that the first dopant type and the second dopant type used herein generally refer to P-type or N-type, wherein the first dopant type is opposite to the second dopant type. Exemplarily, if the first dopant type is one of P-type, low dopant P-type, and high dopant P+ type, then the second dopant type is one of N-type, low dopant N-type, and high dopant N+ type. On the contrary, if the first dopant type is one of N-type, low dopant N-type, and high dopant N+ type, then the second dopant type is one of P-type, low dopant P-type, and high dopant P+ type. Exemplarily, the first type semiconductor substrate is an N-type low dopant substrate, that is, an N-substrate, with dopant concentrations of $1 \times 10^{14}/cm^3$ to $2 \times 10^{14}/cm^3$.

A first dopant type epitaxial layer 101 is formed on the front surface of the semiconductor substrate 100, and the first dopant type epitaxial layer 101 includes a first region 1 and a second region 2. In this embodiment, the semiconductor substrate is an N-substrate, and the first dopant type epitaxial layer is an N-type low dopant epitaxial layer, that is, an N-epitaxial layer. Exemplarily, the thickness and the resistivity of the first dopant type epitaxial layer 101 will affect the withstand voltage capability of the device. The greater the thickness of the first dopant type epitaxial layer 101, the greater the resistivity, the higher the withstand voltage capability of the device. In this embodiment, the formed VDMOS semiconductor device requires that the thickness of the first dopant type epitaxial layer 101 is 45 μm to 65 μm and the resistivity is 15 Ω cm to 25 Ω cm at 650 V.

Exemplarily, a depletion device is provided in the first region 1, an enhanced device is provided in the second region 2. The first dopant type epitaxial layer further includes a third region, which is located between the first region and the second region. Referring back to FIG. 1, the first dopant type epitaxial layer 101 further includes a third region 3 located between the first region 1 and the second region 2. Exemplarily, the third region 3 forms an isolated structure that isolates the depletion device formed in the first region 1 and the enhanced device formed in the second region 2.

Further referring to FIG. 1, the integrated semiconductor device of the present disclosure further includes second dopant type deep wells 102 located in the first dopant type epitaxial layer 101. The second dopant type deep wells 102 includes at least two second dopant type deep wells 1021 located in the first region 1 and at least two second dopant type deep wells 1022 located in the second region 2. In this embodiment, the first type semiconductor substrate is an N-type low dopant substrate, that is, an N-substrate, the first dopant type epitaxial layer is an N-type low dopant epitaxial layer, that is, an N-epitaxial layer, and the second dopant type deep wells are P-wells.

Exemplarily, in a first dopant type epitaxial layer including a third region, at least one second dopant type deep well is formed in the third region. As shown in FIG. 1, at least one of the second dopant type deep wells 1023 is formed in the third region 3, and the second dopant type deep well 1023 of the third region 3 forms a part of the isolation structure.

A method for forming the second dopant type deep wells includes: forming a patterned mask layer on the first dopant type epitaxial layer, the patterned mask layer exposes the regions of the second dopant type deep wells to be formed; performing ion implantation in the second dopant type well regions to form the second dopant type deep wells on the first dopant type epitaxial layer; and removing the patterned mask layer. The method for forming the second dopant type deep wells may be a method well known to a person skilled in the art, and details will not be described for brevity.

In the embodiment, the semiconductor substrate of a first dopant type is an N-type low dopant substrate, that is, an N-type low dopant substrate, the first dopant type epitaxial layer is an N-type low dopant epitaxial layer, that is, an N-type epitaxial layer. The second dopant type deep wells are P-wells, the ions implanted in the second dopant type well regions are boron ions, the implantation energy is between 50 Kev and 200 Kev, and the implantation dose is between $5.0\ E13/cm^2$ and $5.0\ E14/cm^2$.

Further referring to FIG. 1, the integrated semiconductor device described in the present disclosure further includes dielectric islands 103 located on the first dopant type epitaxial layer 101. A part of the dielectric islands 103 is located in the first region 1 and covers a region between the two adjacent second dopant type deep wells 1021 in the first region 1, and the dielectric island 103 in the first region 1 is not in contact with the second dopant type deep wells 1021 in the first region 1. Another part of the dielectric island 103 is located in the second region 2 and covers a region between the two adjacent second dopant type deep wells 1022 in the second region 2, and the dielectric island 103 in the second region 2 is not in contact with the second dopant type deep wells 1022 in the second region 2.

The dielectric island is provided above a region between two adjacent second dopant type deep wells in the first region and a region between two adjacent second dopant type deep wells in the second region, such that during a process of forming a trench of the depletion device, an ion implantation is performed using the dielectric islands as masks to prevent ions from entering an area below the dielectric islands, such that a trench ion concentration of the first dopant type epitaxial layer below the dielectric island is minimized, and a breakdown voltage of the depletion device is increased, thereby greatly improving a breakdown reliability.

The material of the dielectric island may be any type of dielectric material such as silicon oxide, silicon nitride, etc. Exemplarily, the steps of forming the dielectric island include: depositing a dielectric island material layer on the first dopant type epitaxial layer; forming a patterned mask layer on the dielectric island material layer, the patterned mask layer covers a region to form the dielectric islands; etching the dielectric island material layer with the patterned mask layer to form the dielectric islands; and removing the mask layer.

Further referring to FIG. 1, the integrated semiconductor device of the present disclosure further includes gate structures 106 located on the first dopant type epitaxial layer 101. The gate structures 106 cover the dielectric islands 103 and cover a part of the regions of the second dopant type deep wells 102 (including 1021 and 1022) on both sides of the dielectric islands 103. The gate structures 106 include a gate structure 1061 formed on the first region 1 and a gate structure 1062 formed on the second region 2. The gate structure 106 include a gate dielectric layer 107 and a gate material layer 108. The gate structure 1061 in the first region 1 partially covers the adjacent second dopant type deep wells 1021 in the first region 1, and the gate structure 1062 in the second region 2 partially covers the adjacent second dopant type deep wells 1022 in the second region 2. The dielectric islands are formed below the gate structures. For the enhanced device, according to the formula Cox=εox/tox, it can be seen that the thickness of the gate dielectric layer increases due to the presence of the dielectric islands, which reduces the gate capacitance and the switching loss of the device.

Materials of the gate structure 106 and the gate structure may be of any material well-known to those skilled in the art. Exemplarily, the gate dielectric layer is a silicon dioxide material, and the gate material layer is a polycrystalline silicon material. Exemplarily, the thickness of the gate dielectric layer is between 500 Å and 1500 Å; and the thickness of the layer of gate material is between 2000 Å and 10000 Å.

In the embodiment, the second dopant type deep well formed in a third region forms a part of the isolation structure, and the integrated semiconductor device further includes a field oxygen covering the second dopant type deep well in the third region. Exemplarily, the field oxygen and the dielectric island are the same material layer. Referring to FIG. 1, the field oxygen 104 covering the second dopant type deep well 1023 is provided on the third region 3. The field oxygen 104 is provided to cover the second dopant type deep well 1023 of the third region 3, thereby forming the closed isolation structure. Exemplarily, the dielectric island 103 and the field oxygen 104 are of the same material layer, i.e., silicon oxide material. Exemplarily, the thickness of the dielectric island 103 and the field oxygen 104 is between 5000 Å and 10000 Å; and the length of the dielectric island 103 is between 2 μm and 5 μm.

Further referring to FIG. 1, the integrated semiconductor device of the disclosure further includes first dopant type source regions 110 located on both sides of the gate structures 106 and in the second dopant type deep wells 102 (including 1021 and 1022). The first dopant type source regions 110 in the first region 1 are located on both sides of the gate structure 1061 and in the second dopant type deep well 1021. The first dopant type source regions 110 in the same second dopant type deep well 1021 are separated by a region of a part of the second dopant type deep well 1021. The first dopant type source regions 110 in the second region 2 are located in the second dopant type deep wells 1022 on both sides of the gate structure 1062. The first dopant type source regions 110 in the same second dopant type deep well 1022 are separated by the region of a part of the second dopant type deep well 1022.

A method for forming the first dopant type source region includes: forming a patterned mask layer on the first dopant type epitaxial layer, the patterned mask layer exposes regions to form the first dopant type source regions; performing first dopant type source region ion implantation to form the first dopant type source regions; removing the patterned mask layer. In the embodiment, the ion implantation step for forming the first dopant type source regions 110 uses a phosphorus ion implantation step, with an implantation energy between 50 Kev and 150 Kev and an implantation dose between 5.0 E15/cm$^2$ and 1.0 E16/cm$^2$.

In an example, during the formation of the dielectric island, another dielectric island is formed above a region between the first dopant type trenches in the same first dopant type deep well, such that in the step of forming the first dopant type source region, the other dielectric island and the gate structure are used as masks to perform the first dopant type source region ion implantation without the step of forming an additional ion implantation mask, which reduces the number of photolithography masks and photolithography steps in the process.

Further referring to FIG. 1, the integrated semiconductor device of the disclosure further includes first dopant type trenches 105 located on both sides of the dielectric island 103 in the first region 1, the first dopant type trenches extend to the first dopant type source regions 110. The first dopant type trench is provided in the first region, so that the semiconductor device of the first region is configured as a depletion device. Accordingly, the first dopant type trench is not provided in the second region, so that the semiconductor device in the second region is configured as the enhanced device, so that the depletion device and the enhanced device are integrated in the same semiconductor device, the package area of the separate devices is reduced, and the process cost is reduced.

Exemplarily, the forming steps of the first dopant type trench is provided after the formation of the dielectric island and prior to the formation of the gate structure. The method of forming the first dopant type trench includes: forming a patterned mask layer on the first dopant type epitaxial layer, the patterned mask layer exposes regions to form the first dopant type trenches; performing a first dopant type trench ion implantation to form the first dopant type trenches; and removing the patterned mask layer. Exemplarily, the ions implanted into the trench are phosphorus ions, with an implantation energy between 50 Kev and 200 Kev and an implantation dose between 5.0 E12/cm$^2$ and 5.0 E13/cm$^2$.

Exemplarily, as shown in FIG. 1, the integrated semiconductor device described in the disclosure further includes second dopant type source regions 112 that are provided in the second dopant type deep wells 1021 in the first region 1 and in the second dopant type deep wells 1022 in the second region 2. The second dopant type source region 112 is located between the first dopant type source regions 110 and is in contact with the first dopant type source regions 110, and the second dopant type source regions 112 are used to enhance the contact between the source and the deep well.

Exemplarily, as shown in FIG. 1, the semiconductor device further includes second dopant type well regions 109 that are provided in the second dopant type wells 1021 in the first region 1 and in the second dopant type wells 1022 in the second region 2. The second dopant type well regions 109 are located below the first dopant type source regions 110 and the second dopant type source regions 112. The second dopant type well regions 109 formed below the first dopant type source regions 110 and the second dopant type source region 112s can significantly reduce the resistance of the parasitic transistor base region, greatly reduce the risk of switching on the parasitic transistor, and greatly improve the operating stability of the device.

Exemplarily, as shown in FIG. 1, the semiconductor device further includes sources 113 that are insulated from the gate structures 106 by a provided dielectric layer 111. The sources 113 include a first region source 1131 and a second region source 1132. The first region source 1131 is in contact with the second dopant type deep wells 1021 in the first region 1 and the first dopant type source regions 110 in the second dopant type deep wells 1021, and the second region source 1132 is in contact with the second dopant type deep wells 1022 in the second region 2 and the first dopant type source regions 110 in the second dopant type deep wells 1022. The first region source 1131 is not in contact with the second region source 1132, thus forming the source of an independent depletion semiconductor device and the source of an enhanced semiconductor device. In this embodiment, second dopant type source regions 112 are formed in the second dopant type deep wells 1021 in the first region 1 and the second dopant type deep wells 1022 in the second region 2. The first region source 1131 is in contact with the first dopant type source regions 110 and the second dopant type source regions 112 in the first region 1, and the second region source 1132 is in contact with the first dopant type source regions 110 and the second dopant type source regions 112 in the second region 2.

Exemplarily, the step of forming the second dopant type source regions, the second dopant type well regions, and the sources includes: forming a dielectric layer over the first dopant type epitaxial layer, the dielectric layer covers the gate structures to expose a part of the first dopant type source regions and a part of the regions of the deep well regions located between the first dopant type sources; performing a second dopant type source region ion implantation to form second dopant type source regions located between the first dopant type source regions; performing a second dopant type well region ion implantation to form second dopant type well regions below the first dopant type source regions and the second dopant type source regions; forming sources on the first dopant type epitaxial layer, the sources include a first region source in contact with the second dopant type deep wells of the first region and a second region source in contact with the second dopant type deep wells of the second region, and the first region source is not in contact with the second region source.

Exemplarily, the ion implantation step of forming the second dopant type source regions is a boron ion or boron difluoride ion implantation step, the implantation energy is between 50 Kev and 200 Kev, and the implantation dose is between $5.0 \text{ E}14/\text{cm}^2$ and $5.0 \text{ E}15/\text{cm}^2$.

Exemplarily, the ion implantation step of forming the second dopant type well region is a boron ion implantation step, the implantation energy is between 150 Kev and 300 Kev and an implantation dose is between $1.0 \text{ E}15/\text{cm}2$ and $5.0 \text{ E}15/\text{cm}2$. The sources use one of conventional aluminum and copper or alloys thereof.

The step of forming the sources 113 includes: depositing a source material layer and patterning the source material layer to form the sources. The steps of etching the dielectric layer, depositing the source material layer, and patterning the source material layer are well known to those skilled in the art, and will not be described for brevity.

Exemplarily, as shown in FIG. 1, the semiconductor device further includes a drain 114 formed on the rear side of the semiconductor substrate 100. As a result, a complete integrated VDMOS device integrated with depletion VDMOS device and enhanced VDMOS device is formed. It should be understood that the VDMOS devices in the embodiment are merely exemplary and not intended to limit the scope of the disclosure. A person skilled in the art sets other types of devices as required. At the same time, in order to enlarge the disclosure field and efficiency of the devices, multiple semiconductor devices can be integrated as needed, such as one or more diodes, transistors, resistors, capacitors, JFETs, current-induced VDMOS, CMOS and other semiconductor devices.

EXAMPLE 2

In the embodiment, an integrated IGBT device is also provided, which includes a depletion IGBT device and an enhanced IGBT device. Specifically, the semiconductor substrate in Embodiment 1 is configured to the second dopant type, that is, the semiconductor substrate is a P-type substrate, while the formation position and dopant type of the rest of components in Embodiment 1 remain unchanged. Specifically, the IGBT device includes:

a semiconductor substrate of a second dopant type;

a first dopant type epitaxial layer located on a front side of the semiconductor substrate, including a first region, a second region, and a third region, an isolation structure is provided in the third region;

second dopant type deep wells located in the first dopant type epitaxial layer, which includes at least two second dopant type deep wells located in the first region and at least two second dopant type deep wells located in the second region;

dielectric islands located on the first dopant type epitaxial layer, a part of the dielectric islands covers a region between two adjacent second dopant type deep wells in the first region, a part of the dielectric islands covers a region between two adjacent second dopant type deep wells in the second region, and the dielectric islands are not in contact with the adjacent second dopant type deep wells;

gate structures located on the first dopant type epitaxial layer and covering a part of the regions of the second dopant type deep wells on both sides of the dielectric islands and the dielectric islands;

first dopant type source regions located below both sides of the gate structures and in the second dopant type deep wells, and the first dopant type source regions located in the same second dopant type deep well are separated by a region of the first dopant type deep well; and first dopant type trenches located in the first dopant type epitaxial layer on both sides of the dielectric island, the first dopant type trenches extend laterally to the first dopant type source regions;

the first dopant type is opposite to the second dopant type.

Reference can be made to Embodiment 1 for specific device layout and formation, and details will not be described for brevity.

Exemplarily, the IGBT device is used in parallel with a fast recovery diode to improve the current sharing effect of the device and the stability and reliability of the system operation.

EMBODIMENT 3

A structure of another integrated semiconductor device according to the disclosure will be described later with reference to FIG. 2.

Figure 2:
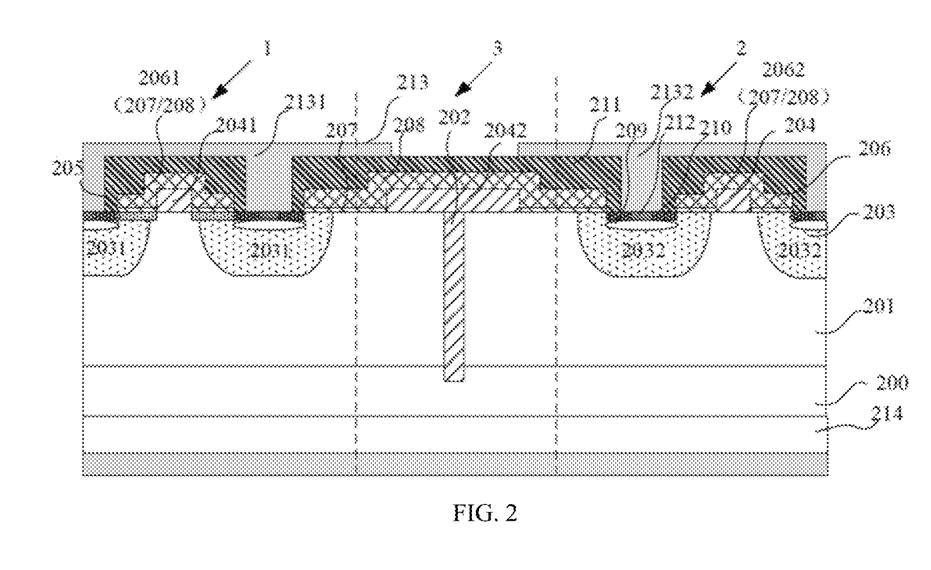
FIG. 2 is a schematic diagram of a semiconductor device according to another embodiment of the present disclosure.

As shown in FIG. 2, the integrated semiconductor device according to the present disclosure includes a semiconductor substrate 200. The semiconductor substrate 200, specifically, may be at least one of the following materials mentioned: Si, Ge, SiGe, SiC, SiGeC, InAs, GaAs, InP, InGaAs or other III/V compound semiconductors, and may also include multilayer structures formed by these semiconductors, or may be silicon on an insulator (SOI), stacked silicon on an insulator (SSOI), stacked silicon germanide on an insulator (S—SiGeOI), silicon germanide on an insulator (SiGeOI), and germanium on an insulator (GeOI). Exemplarily, the semiconductor substrate is a first dopant type.

It should be noted that the first dopant type and the second dopant type in this specification generally refer to P-type or N-type, the first dopant type is opposite to the second dopant type. Exemplarily, if the first dopant type is one of P-type, low dopant P-type, and high dopant P+ type, then the second dopant type is one of N-type, low dopant N-type, and high dopant N+ type. On the contrary, if the first dopant type is one of N-type, low dopant N-type, and high dopant N+ type, then the second dopant type is one of P-type, low dopant P-type, and high dopant P+ type. Exemplarily, the semiconductor substrate is an N-type low dopant substrate, that is, an N-substrate, with dopant concentrations of $1\times10^{14}/cm^3$ to $2\times10^{14}/cm^3$.

Referring to FIG. 2, the integrated semiconductor device according to the disclosure includes a first dopant type epitaxial layer 201 located on the front side of the semiconductor substrate 200. In the embodiment, the semiconductor substrate is an N-type low dopant substrate, that is, an N-substrate, and the first dopant type epitaxial layer is an N-type low dopant epitaxial layer, that is, an N-epitaxial layer. Exemplarily, the thickness and resistivity of the first dopant type epitaxial layer 201 will affect the withstand voltage capability of the device. The thicker the thickness of the first dopant type epitaxial layer 201, the greater the resistivity, the higher the withstand voltage capability of the device. In the embodiment, the formed VDMOS semiconductor device requires that the thickness of the first dopant type epitaxial layer 101 is 45 μm to 65 μm and the resistivity is 15Ω·cm to 25Ω·cm at 650 V.

The first dopant type epitaxial layer 201 includes a first region 1, a second region 2, and a third region 3; the first region 1 is provided with a depletion device, the second region 2 is provided with an enhanced device, the third region is provided with at least one trench 202, and the trench is filled with a dielectric material layer to isolate the depletion device and the enhanced device. Exemplarily, the dielectric material layer is one or a combination of an oxide layer, polysilicon, TEOS, and BPSG.

The isolation structure provided by the trench 202 prevents the current trenches that may be formed between the depletion device and the enhancement device on both sides of the trench, and isolates the depletion device and the enhancement device. The depth of the trench may be less than or equal to the thickness of the first dopant type epitaxial layer, or may be greater than or equal to the thickness of the first dopant type epitaxial layer, both can provide an isolation effect. The number of the trenches will affect the isolation effect, the more the trenches, the better the isolation effect. Also, the isolation structure is provided by a trench. Compared with the isolation structure provided by a deep well, the isolation structure area is effectively reduced, and the chip area is saved.

Exemplarily, the depth of the trench is greater than or equal to the thickness of the first dopant type epitaxial layer, that is, the trench penetrates the first dopant type epitaxial layer. As shown in FIG. 1, the trench 202 extends into the semiconductor substrate 200 through the first dopant type epitaxial layer 201.

The trenches are provided to penetrate the first dopant type epitaxial layer, thereby completely obstacle a current channel that may be formed between the depletion device and the enhanced device in the epitaxial layer and on both sides of the trench, thereby significantly improving the isolation characteristics of the depletion device and the enhanced device. Also, in such a configuration, a maximum isolation effect can be achieved without further providing multiple isolation trenches, thereby further reducing the area of the isolation structure and saving the chip area.

Further referring to FIG. 2, the integrated semiconductor device according to the present disclosure further includes a second dopant type deep well 203 located in the first dopant type epitaxial layer 201, the second dopant type deep well 203 includes at least two second dopant type deep wells 2031 located in the first region 1 and at least two second dopant type deep wells 2032 located in the second region 2. In the embodiment, the semiconductor substrate is an N-type low dopant substrate, that is, an N-substrate, the first dopant type epitaxial layer is an N-type low dopant epitaxial layer, that is, an N-epitaxial layer, and the second dopant type deep well is a P-well.

Further referring to FIG. 2, the integrated semiconductor device according to the present disclosure further includes a plurality of dielectric islands 204 formed on the first dopant type epitaxial layer 201, the dielectric islands 204 include a first dielectric island 2041 and a second dielectric island 2042. The first dielectric island 2041 is located above the region between the two adjacent second dopant type deep wells 2031 in the first region 1 and above the region between the two adjacent second dopant type deep wells 2032 in the second region 2. In the first region 1, the dielectric island 2041 is not in contact with the two adjacent second dopant type deep wells 2031, and in the second region 2, the dielectric island 2041 is not in contact with the two adjacent second dopant type deep wells 2032.

The first dielectric island 2041 is formed above the region between the two adjacent second dopant type deep wells in the first region and in the second region. Therefore, in the process of forming the trench of the depletion device, the first dielectric island 2041 is used as a mask to perform the ion implantation. As the presence of the dielectric island obstacles the ion implantation of the trench, the ion concentration below the dielectric island is low, and the breakdown reliability of the device in the on state is greatly improved.

The second dielectric island 2042 covers the filled trench, forming a closed trench structure, forming a complete isolation structure between the enhanced device and the depletion device to effectively isolate the enhanced device and the depletion device. Exemplarily, the filling materials of the dielectric island and the trench are the same material.

Exemplarily, the width of the trench is 0.5 to 2 μm. The filling materials of the dielectric island and the trench are the same material which is a thermo-oxidation layer.

Exemplarily, the material filled in the trench is the same material as the dielectric island material. Exemplarily, the step of filling the trench to form the dielectric island on the first dopant type epitaxial layer includes performing a deposition process to form a dielectric material layer covering the first dopant type epitaxial layer and filling the trench; patterning the dielectric material layer to form the dielectric island. The dielectric material layer filled in the trench and the dielectric island are set as the same material, so that the filling of the trench and the formation of the dielectric island are configured in the same step, the process flow is reduced and the process cost is reduced.

Further, the width of the trench is between 0.5 μm and 2 μm, and both the dielectric material filled in the trench and the material of the dielectric island are thermal silicon oxide layers. The step of filling the trench to form the dielectric island on the first dopant type epitaxial layer includes performing a thermal oxidation process to form an oxide layer covering the surface of the first dopant type epitaxial layer and filling the trench; patterning the oxide layer to form the dielectric island. Exemplarily, the thickness of the dielectric island 204 is 5000 Å~10000 Å, the length of the dielectric island 204 is between 2 μm and 5 μm. Both the dielectric material filled in the trench and the material of the dielectric island are configured as a thermal silicon oxide layer, which reduces the step of re-covering the dielectric material layer in the trench and filling the trench, the steps of the process is reduced while forming a dense filling material.

Further referring to FIG. 2, the integrated semiconductor device according to the present disclosure further includes gate structures 206 located on the first dopant type epitaxial layer 201 and cover the dielectric islands 204 (including 2041 and 2042) and partially cover parts of the regions of the second dopant type deep wells 203 on both sides of the dielectric islands 204. The gate structures 206 include a gate structure 2061 formed on the first region 1 and a gate structure 2062 formed on the second region 2. The gate structures 206 include a gate dielectric layer 207 and a gate material layer 208. The gate structure 2061 in the first region 1 partially covers the adjacent second dopant type deep wells 2031 in the first region 1, the gate structure 2062 in the second region 2 partially covers the adjacent second dopant type deep wells 2032 in the second region 2, and a plurality of first dielectric islands 2041 are covered under the gate structures 206.

The first dielectric island 2041 is covered under the gate structure 206. According to the formula Cox=εox/tox, the thickness of the gate dielectric layer increases due to the presence of the first dielectric island, which reduces the gate capacitance and the switching loss of the device. In the embodiment, as shown in FIG. 1G, the gate structure 206 further covers the third dielectric island 2042.

The gate structure 206 and the material of the gate structure may be any material well known to those skilled in the art. Exemplarily, the gate dielectric layer is of silicon dioxide material, and the gate material layer is of polycrystalline silicon material. Exemplarily, the thickness of the gate dielectric layer is between 500 Å and 1500 Å; and the thickness of the layer of gate material is between 2000 Å and 10000 Å.

Further referring to FIG. 2, the integrated semiconductor device according to the present disclosure further includes first dopant type source regions 210 located on both sides of the gate structure 206 and in the second dopant type deep wells 203, the first dopant type source regions 210 located in the same second dopant type deep well 203 are separated by parts of the regions of the second dopant type deep well 203.

The method for forming the first dopant type source region may be as described in Example 1, and will not be described for brevity.

Further referring to FIG. 1G, the integrated semiconductor device according to the present disclosure further includes first dopant type trenches 205 located on both sides of the dielectric island 204 in the first region 1, the first dopant type trenches extend to the first dopant type source region 210.

Exemplarily, as shown in FIG. 2, the semiconductor device further includes second dopant type source regions 212 respectively formed in the second dopant type deep wells 2031 in the first region 1 and second dopant type deep wells 2032 in the second region 2, the second dopant type source regions 212 is located between the first dopant type source regions 210, the second dopant type source region is configured to enhance the contact between the source and the deep well.

Exemplarily, as shown in FIG. 2, the semiconductor device further includes second dopant type source regions 209 respectively formed in the second dopant type deep wells 2031 in the first region 1 and second dopant type deep wells 2032 in the second region 2, the second dopant type source regions 209 is located below the first dopant type source region 210 and the second dopant type source region 212.

The second dopant type well region 209 is provided under the first dopant type source region 210 and the second dopant type source region 212, which can significantly reduce the resistance of the parasitic transistor base region, greatly reduce the risk of the parasitic transistor opening, and greatly improve the operating stability of the device.

Exemplarily, as shown in FIG. 2, the semiconductor device further includes sources 213, and a dielectric layer 211 is provided between the sources and the gate structure 206. The sources 213 include a first region source 2131 and a second region source 2132. The first region source 2131 is in contact with a second dopant type deep well 2031 in the first region 1 and a first dopant type source region 210 in the second dopant type deep well 2031, and the second region source 2132 is in contact with a second dopant type deep well 2032 in the second region 2 and a first dopant type source region 210 in the second dopant type deep well 2032, the first region source 2131 is insulated from the second region source 2132. As a result, the source of an independent depletion semiconductor device and the source of an enhanced semiconductor device are formed. In the embodiment, second dopant type source regions 212 is formed in the second dopant type deep well 2031 in the first region 1 and the second dopant type deep well 2032 in the second region 2, the first region source 2131 is in contact with the first dopant type source region 210 and the second dopant type source region 212 in the first region 1, and the second region source 2132 is in contact with the first dopant type source region 210 and the second dopant type source region 212 in the second region 2.

The steps of forming the second dopant type source region, the second dopant type well region, and the source may be described in one of the examples, and will not be described for brevity.

Exemplarily, as shown in FIG. 2, the semiconductor device further includes a drain 214 formed on the rear side of the semiconductor substrate 200. As a result, a complete integrated VDMOS device with depletion VDMOS device and enhanced VDMOS device is formed. It should be understood that the VDMOS devices in the embodiment are merely exemplary and not intended to limit the scope of the disclosure. A person skilled in the art sets other types of devices as required. At the same time, in order to enlarge the disclosure field and efficiency of the devices, multiple semiconductor devices can be integrated as needed, such as one or more diodes, transistors, resistors, capacitors, JFETs, current-induced VDMOS, CMOS and other semiconductor devices.

EMBODIMENT 4

In the embodiment, there is also provided an integrated IGBT device including a depletion IGBT device and an enhanced IGBT device. Specifically, the semiconductor substrate in the Embodiment 3 is set to a second dopant type. Exemplarily, the semiconductor substrate is a P-type substrate, and the forming position and dopant type of other components of Embodiment 1 remain unchanged. Specifically, the IGBT device includes:

A semiconductor substrate of a second dopant type;

A first dopant type epitaxial layer located on a front side of the semiconductor substrate, the first dopant type epitaxial layer includes a first region, a second region, and a third region, an isolation structure is provided in the third region;

Second dopant type deep wells located in the first dopant type epitaxial layer, including at least two second dopant type deep wells located in the first region and at least two second dopant type deep wells located in the second region;

Dielectric islands located on the first dopant type epitaxial layer, a part of the dielectric islands cover the region between the two adjacent second dopant type deep wells in the first region, a part of the dielectric islands cover the region between the two adjacent second dopant type deep wells in the second region, and the dielectric islands are not in contact with the adjacent second dopant type deep wells;

Gate structure located on the first dopant type epitaxial layer and covering a part of the regions of the second dopant type deep wells on both sides of the dielectric islands and the dielectric islands;

First dopant type source regions located in the second dopant type deep wells below both sides of the gate structures, and the first dopant type source regions in the same second dopant type deep well are separated by a part of a region of the first dopant type deep well; and First dopant type trenches located on both sides of the dielectric islands and in the first dopant type epitaxial layer, the first dopant type trenches extend laterally to the first dopant type source regions;

The first dopant type is opposite to the second dopant type.

Reference can be made to Embodiment 3 for specific device layout and formation, and details will not be described for brevity.

Exemplarily, the IGBT device is used in parallel with the fast recovery diode to improve the current sharing effect of the device and the stability and reliability of the system operation.

EXAMPLE 5

The disclosure further provides an electronic apparatus, including at least one of the integrated semiconductor devices described in Example 1, Example 2, Example 3, and Example 4.

The electronic apparatus of the embodiment may be any electronic product or device applied in the field of communications, aerospace, laser, communications, robotics, etc., or may be any intermediate product including circuitry. The electronic apparatus in the embodiment of the disclosure has better performance because the foregoing semiconductor device is used.

The electronic apparatus of the disclosure not only includes the integrated semiconductor device described in the foregoing embodiments, but also includes a semiconductor device such as a diode, a transistor, a resistor, a capacitor, a JFET, a current-induced VDMOS, and a CMOS. An isolation structure is provided between the depletion semiconductor device and another type of semiconductor device to prevent passage between the semiconductor device.

The integrated semiconductor device of the embodiment may be any electronic product or device applied to industrial equipment, power supply system, large electric equipment, electric vehicle, photovoltaic power supply facility, server, consumer electronic equipment, household appliances and the like, and may be any intermediate product including circuits, such as commonly used in LED drive power supply, power adapter, charging device and the like. The disclosure is not only conducive to integration of the system, but also less lithography levels, more simplified process flow, low production cost, low surge resistance, high switching loss, suitable for working under harsh working conditions and higher frequency.

The foregoing respective technical features involved in the respective embodiments can be combined arbitrarily, for brevity, not all possible combinations of the respective technical features in the foregoing embodiments are described, however, to the extent they have no collision with each other, the combination of the respective technical features shall be considered to be within the scope of the description.

The foregoing implementations are merely specific the embodiment of the present disclosure, and are not intended to limit the protection scope of the present disclosure. It should be noted that any variation or replacement readily figured out by persons skilled in the art within the technical scope disclosed in the present disclosure shall all fall into the protection scope of the present disclosure. Therefore, the protection scope of the present disclosure shall be subject to the protection scope of the claims.

What is claimed is:

1. An integrated semiconductor device, comprising:
   a semiconductor substrate;
   a first dopant type epitaxial layer located on a front side of the semiconductor substrate and comprising a first region, a second region, and a third region, wherein an isolation structure is provided in the third region;
   second dopant type deep wells located in the first dopant type epitaxial layer, comprising at least two second dopant type deep wells located in the first region and at least two second dopant type deep wells located in the second region;
   dielectric islands located on the first dopant type epitaxial layer, a part of the dielectric islands covering a region between two adjacent second dopant type deep wells in the first region, a part of the dielectric islands covering a region between two adjacent second dopant type deep wells in the second region, and the dielectric islands being not in contact with the adjacent second dopant type deep wells;

gate structures located on the first dopant type epitaxial layer and covering the dielectric islands and a part of regions of the second dopant type deep wells on both sides of the dielectric island;

first dopant type source regions located in the second dopant type deep wells below both sides of the gate structures, and the first dopant type source regions in the same second dopant type deep well being separated by a part of a region of a second dopant type source region; and first dopant type trenches located on both sides of the part of the dielectric islands located in the first region, and in the first dopant type epitaxial layer, the first dopant type trenches extending laterally to the first dopant type source regions;

wherein the first dopant type is opposite to the second dopant type;

wherein the isolation structure comprises at least one of the second dopant type deep wells located in the third region and a field oxygen covering the second dopant type deep well in the third region.

2. The integrated semiconductor device according to claim 1, wherein the dielectric island has a thickness ranging from 5000 Å to 10000 Å.

3. The integrated semiconductor device according to claim 1, wherein the dielectric island has a length ranging from 2 μm to 5 μm.

4. The integrated semiconductor device according to claim 1, wherein the isolation structure comprises at least one trench and the dielectric island covering the trench, and the trench is filled with a dielectric material layer.

5. The integrated semiconductor device according to claim 4, wherein a depth of the trench is equal to or greater than a thickness of the first dopant type epitaxial layer.

6. The integrated semiconductor device according to claim 4, wherein a width of the trench is 0.5 μm to 2 μm.

7. The integrated semiconductor device according to claim 4, wherein the dielectric island and the trench are filled with thermal silicon oxide.

8. The integrated semiconductor device according to claim 1, wherein the gate structure comprises a gate dielectric layer and a gate material layer.

9. The integrated semiconductor device according to claim 8, wherein the gate dielectric layer is of a silicon dioxide material and the gate material layer is of polycrystalline silicon material.

10. The integrated semiconductor device according to claim 8, wherein the gate dielectric layer has a thickness ranging from 500 Å to 1500 Å and the gate material layer has a thickness ranging from 2000 Å~10000 Å.

11. The integrated semiconductor device according to claim 1, further comprising a drain formed on a rear side of the semiconductor substrate.

12. The integrated semiconductor device according to claim 1, wherein the first dopant type epitaxial layer has a thickness of 45 μm to 65 μm and a resistivity of 15Ω·cm to 25Ω·cm.

13. The integrated semiconductor device according to claim 1, wherein the semiconductor substrate is a semiconductor substrate of a first dopant type, the integrated semiconductor device comprises a VDMOS device comprising a depletion VDMOS device located in the first region and an enhanced VDMOS device located in the second region.

14. The integrated semiconductor device according to claim 1, wherein the semiconductor substrate is a semiconductor substrate of a second dopant type, the integrated semiconductor device comprises an IGBT device comprising a depletion IGBT device located in the first region and an enhanced IGBT device located in the second region.

15. An electronic apparatus comprising the integrated semiconductor device according to claim 1.

16. An integrated semiconductor device, comprising:
a semiconductor substrate;
a first dopant type epitaxial layer located on a front side of the semiconductor substrate and comprising a first region, a second region, and a third region, wherein an isolation structure is provided in the third region;
second dopant type deep wells located in the first dopant type epitaxial layer, comprising at least two second dopant type deep wells located in the first region and at least two second dopant type deep wells located in the second region;
dielectric islands located on the first dopant type epitaxial layer, a part of the dielectric islands covering a region between two adjacent second dopant type deep wells in the first region, a part of the dielectric islands covering a region between two adjacent second dopant type deep wells in the second region, and the dielectric islands being not in contact with the adjacent second dopant type deep wells;
gate structures located on the first dopant type epitaxial layer and covering the dielectric islands and a part of regions of the second dopant type deep wells on both sides of the dielectric island;
first dopant type source regions located in the second dopant type deep wells below both sides of the gate structures, and the first dopant type source regions in the same second dopant type deep well; and
first dopant type trenches located on both sides of the part of the dielectric islands located in the first region, and in the first dopant type epitaxial layer, the first dopant type trenches extending laterally to the first dopant type source regions;
wherein the first dopant type is opposite to the second dopant type;
second dopant type source regions in the second dopant type deep wells in the first region and the second region, wherein the second dopant type source regions are located between the first dopant type source regions and in contact with the first dopant type source regions.

17. The integrated semiconductor device according to claim 16, further comprising second dopant type well regions in the second dopant type deep wells in the first region and the second region, wherein the second dopant type well regions are located below the first dopant type source regions and the second dopant type source regions.

18. An integrated semiconductor device, comprising:
a semiconductor substrate;
a first dopant type epitaxial layer located on a front side of the semiconductor substrate and comprising a first region, a second region, and a third region, wherein an isolation structure is provided in the third region;
second dopant type deep wells located in the first dopant type epitaxial layer, comprising at least two second dopant type deep wells located in the first region and at least two second dopant type deep wells located in the second region;
dielectric islands located on the first dopant type epitaxial layer, a part of the dielectric islands covering a region between two adjacent second dopant type deep wells in the first region, a part of the dielectric islands covering a region between two adjacent second dopant type deep wells in the second region, and the dielectric islands being not in contact with the adjacent second dopant type deep wells;

gate structures located on the first dopant type epitaxial layer and covering the dielectric islands and a part of regions of the second dopant type deep wells on both sides of the dielectric island;

first dopant type source regions located in the second dopant type deep wells below both sides of the gate structures, and the first dopant type source regions in the same second dopant type deep well being separated by a part of a region of a second dopant type source region; and first dopant type trenches located on both sides of the part of the dielectric islands located in the first region, and in the first dopant type epitaxial layer, the first dopant type trenches extending laterally to the first dopant type source regions;

wherein the first dopant type is opposite to the second dopant type;

sources insulated from the gate structures, the sources comprising a first region source and a second region source, the first source being in contact with the second dopant type deep wells in the first region and the first dopant type source region in the second dopant type deep well, the second source being in contact with the second dopant type deep well in the second region and the first dopant type source region in the second dopant type deep well, the first region source being insulated from the second region source.

19. The integrated semiconductor device according to claim 18, wherein the source is insulated from the gate structure by a dielectric layer.

* * * * *